(12) United States Patent
Kim

(10) Patent No.: US 7,674,714 B2
(45) Date of Patent: Mar. 9, 2010

(54) METHOD OF FABRICATING SEMICONDUCTOR DEVICES HAVING A GATE SILICIDE

(75) Inventor: Ki-Chul Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 13 days.

(21) Appl. No.: 12/007,430

(22) Filed: Jan. 10, 2008

(65) Prior Publication Data

US 2008/0171414 A1    Jul. 17, 2008

(30) Foreign Application Priority Data

Jan. 11, 2007    (KR) ...................... 10-2007-0003268

(51) Int. Cl.
*H01L 21/44* (2006.01)

(52) U.S. Cl. .................. 438/682; 438/201; 438/216; 438/253; 438/286; 438/299; 438/303; 438/305; 257/E21.438

(58) Field of Classification Search .................. 438/267
See application file for complete search history.

(56) References Cited

U.S. PATENT DOCUMENTS 5,661,052 A * 8/1997 Inoue et al. ................. 438/303
5,714,398 A   2/1998 Chao et al.
5,731,239 A * 3/1998 Wong et al. ................. 438/296
6,271,133 B1  8/2001 Lim et al.
6,355,543 B1  3/2002 Yu
6,777,759 B1* 8/2004 Chau et al. ................. 257/377
2006/0154461 A1 7/2006 Zhu et al.

FOREIGN PATENT DOCUMENTS

| JP | 2001-274385 | 10/2001 |
| JP | 2006-080321 | 3/2006 |
| KR | 10-2005-0079187 | 8/2005 |
| KR | 10-2005-0087660 | 8/2005 |

OTHER PUBLICATIONS

Korean Office Action dated Jan. 18, 2008.
Korean Decision to Grant dated Jun. 12, 2008.

* cited by examiner

*Primary Examiner*—N Drew Richards
*Assistant Examiner*—Kyoung Lee
(74) *Attorney, Agent, or Firm*—Harness, Dickey & Pierce

(57) ABSTRACT

A method of fabricating a semiconductor device according to an example embodiment may include forming an isolation layer defining an active region in a semiconductor substrate, forming a silicon pattern and a sacrificial pattern on the active region, the sacrificial pattern including a semiconductor material different from the silicon pattern, forming a gate spacer on a sidewall of the silicon pattern and a sidewall of the sacrificial pattern, removing the sacrificial pattern to expose a top surface of the silicon pattern, and/or forming a gate silicide on the silicon pattern.

22 Claims, 16 Drawing Sheets

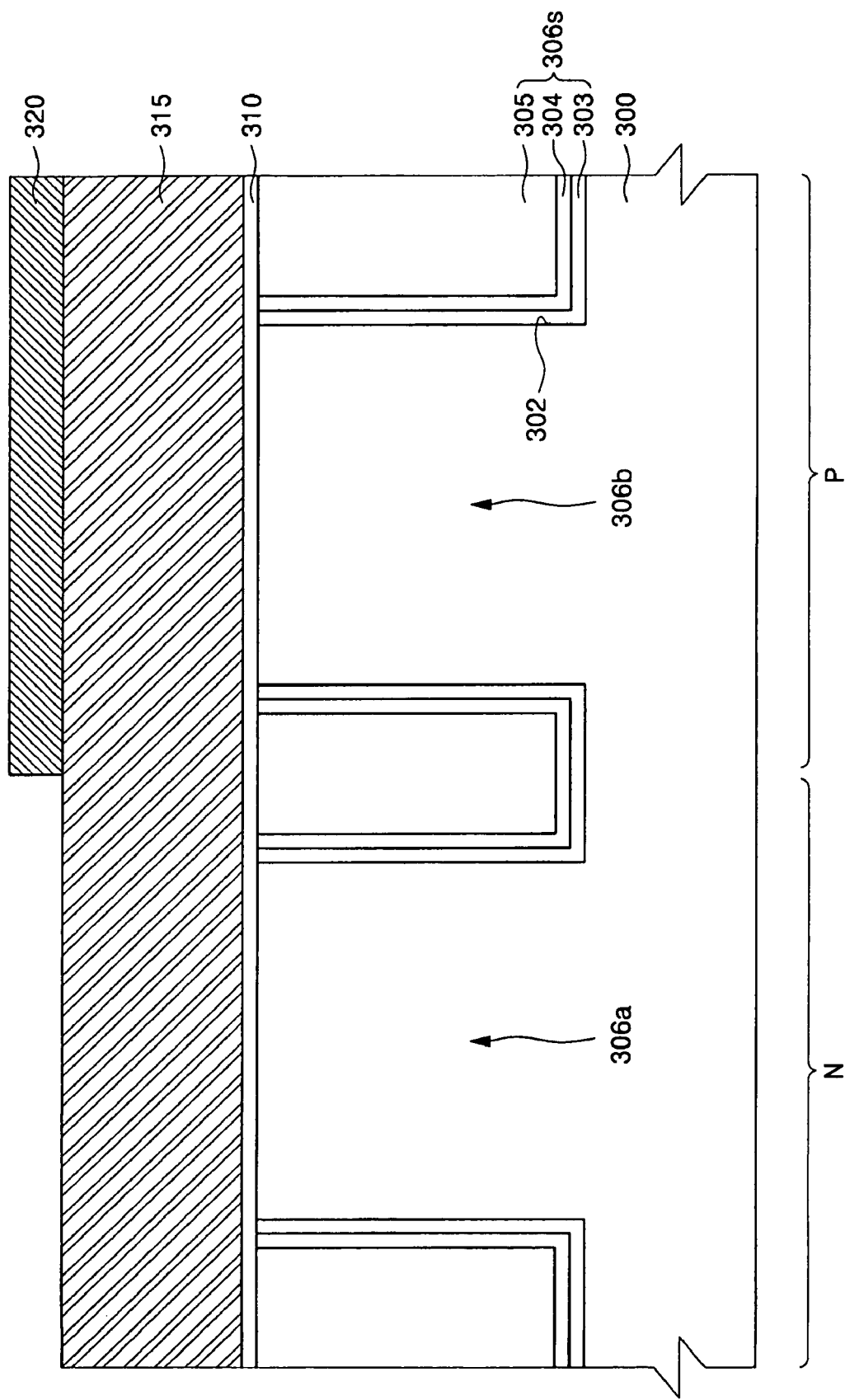

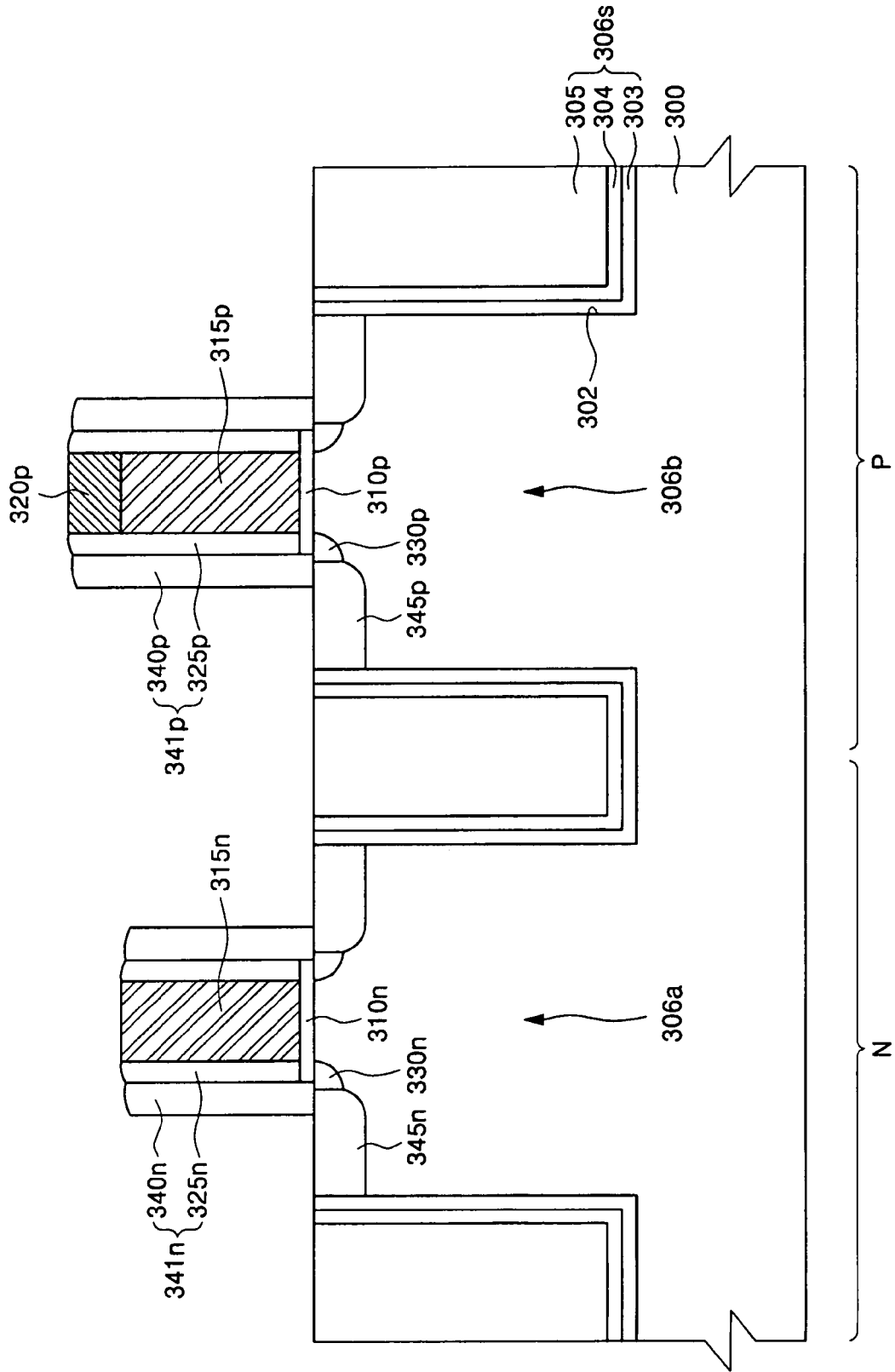

METHOD OF FABRICATING SEMICONDUCTOR DEVICES HAVING A GATE SILICIDE

PRIORITY STATEMENT

This application claims priority under U.S.C. § 119 to Korean Patent Application No. 10-2007-0003268, filed on Jan. 11, 2007, in the Korean Patent Office, the entire contents of which are incorporated herein by reference.

BACKGROUND

1. Field

Example embodiments are directed to a method of fabricating semiconductor devices, for example, a method of fabricating semiconductor devices having a gate silicide.

2. Description of Related Art

In semiconductor devices, discrete devices, for example, MOS transistors, may be used as switching devices. As integration densities of semiconductor devices increase, the MOS transistors may be gradually scaled down. As a result, channel lengths of the MOS transistors may be shortened, and short channel effects may occur. The shortening of the channel lengths may result in a more narrow width of gate electrodes. Accordingly, electrical resistance of the gate electrodes may increase, and gate capacitance C as well as the resistance R of the gate electrodes may increase. Transmission speed of electrical signals applied to the gate electrodes may become slower due to an increased resistance-capacitance (RC) delay time.

A method of reducing an electrical resistance of a gate electrode may be applied to reduce this effect. For example, a polysilicon layer pattern and a titanium nitride layer pattern may be formed on a semiconductor substrate, and a gate spacer may be formed on the sidewalls of the polysilicon layer pattern and the titanium nitride layer pattern. The polysilicon layer pattern and the titanium nitride layer pattern may be formed sequentially, for example. A titanium layer may be formed on the semiconductor substrate including the gate spacer, and rapid thermal annealing may be performed to form a source/drain silicide including titanium silicide. The titanium nitride layer pattern may function as a silicide barrier layer to reduce or prevent silicide from being formed by the reaction of the polysilicon layer pattern and the titanium layer. The unreacted titanium layer and the titanium nitride layer pattern may be removed. A cobalt layer may be deposited and annealed to form a gate silicide including cobalt silicide. The titanium nitride layer pattern may not be completely removed because of a large diameter of a semiconductor wafer used when fabricating a semiconductor device with a narrow critical dimension gate electrode. When gate silicide is formed with the titanium nitride layer pattern not being completely removed, the remaining titanium nitride layer pattern may obstruct the gate silicide formation, which may lead to deterioration of electrical characteristics of the gate electrode.

SUMMARY

Example embodiments are directed to a method of fabricating semiconductor devices having a gate silicide.

A method of fabricating a semiconductor device according to an example embodiment may include forming an isolation layer defining an active region in a semiconductor substrate, forming a silicon pattern and a sacrificial pattern on the active region, the sacrificial pattern including a semiconductor material different from the silicon pattern, forming a gate spacer on a sidewall of the silicon pattern and a sidewall of the sacrificial pattern, removing the sacrificial pattern to expose a top surface of the silicon pattern, and/or forming a gate silicide on the silicon pattern.

The sacrificial pattern may include germanium (Ge).

The sacrificial pattern may be formed of a germanium (Ge) layer or a silicon germanium (SiGe) layer.

Forming the gate spacer may include forming an inside spacer on the sidewall of the silicon pattern and the sidewall of the sacrificial pattern, forming a spacer insulating layer on the semiconductor by using a chemical vapor deposition method, and/or anisotropically etching the spacer insulating layer. Forming the gate spacer may further include forming a lightly doped drain (LDD) region by implanting first impurity ions into the active region using at least one of the sacrificial pattern, the inside spacer and the isolation layer as a mask for ion implantation.

The method may also include forming a source/drain region by implanting second impurity ions into the active region using at least one of the sacrificial pattern, the gate spacer and the isolation layer as a mask for ion implantation.

Removing the sacrificial pattern may expose the top surface of the silicon pattern at a lower level than the top surface of the gate spacer.

The method may also include forming a source/drain silicide in the active region at both sides of the silicon pattern. Forming the gate silicide and the source/drain silicide may include forming a metal layer on the semiconductor substrate, forming silicides by performing an annealing process on the semiconductor substrate to react the metal layer and the silicon pattern, and/or removing unreacted portions of the metal layer.

The method may also include forming an insulating mask layer on the semiconductor substrate, and/or forming a mask pattern by planarizing the insulating mask layer until the top surface of the sacrificial pattern is exposed.

The method may also include forming an interlayer insulating layer on the semiconductor substrate, forming a contact hole passing through the interlayer insulating layer and the mask pattern to expose the active region on both sides of the silicon pattern, and/or forming a source/drain silicide in the active region exposed by the contact hole.

The gate silicide may include silicon and at least one of nickel (Ni), cobalt (Co), tungsten (W), tantalum (Ta), titanium (Ti), hafnium (Hf) and platinum (Pt).

A method of fabricating a semiconductor device according to another example embodiment may include forming an isolation layer defining a first active region and a second active region in a semiconductor substrate, forming a first silicon pattern in the first active region and forming a second silicon pattern and a sacrificial pattern in the second active region, the sacrificial pattern including a semiconductor material different from the first and second silicon patterns, forming a first gate spacer on a sidewall of the first silicon pattern and forming a second gate spacer on a sidewall of the second silicon pattern and a sidewall of the sacrificial pattern, removing the sacrificial pattern to expose a top surface of the second silicon pattern, and/or forming a first gate silicide on the first silicon pattern and forming a second gate silicide on the second silicon pattern.

The first active region may be an active region of an NMOS transistor and the second active region may be an active region of a PMOS transistor.

Forming the first silicon pattern, the second silicon pattern and the sacrificial pattern may include forming a silicon layer on the first active region and the second active region, forming a sacrificial layer on the silicon layer on the second active region, and/or patterning the silicon layer on the first active region and patterning the silicon layer and the sacrificial layer on the second active region.

Forming the first silicon pattern, the second silicon pattern and the sacrificial pattern may include forming a silicon layer on the first active region and the second active region, forming a hard mask on the silicon layer formed on the first active region to expose the silicon layer formed on the second active region, forming a sacrificial layer on the silicon layer on the second active region using an epitaxial growth technique, removing the hard mask, and/or patterning the silicon layer formed on the first active region and patterning the silicon layer and the sacrificial layer on the second active region.

The sacrificial pattern may include germanium (Ge).

The sacrificial pattern may be formed of a germanium layer or a silicon germanium layer.

Forming the first and second gate spacers may include forming a first inside spacer on the sidewall of the first silicon pattern and forming a second inside spacer on the sidewall of the second silicon pattern and the sidewall of the sacrificial pattern, forming a spacer insulating layer on the semiconductor substrate having the first and second inside spacers using a chemical vapor deposition method, and/or anisotropically etching the spacer insulating layer. Forming the first and second gate spacers may also includes forming a first LDD region by implanting impurity ions having a first conductivity type into the first active region at both sides of the first silicon pattern, and/or forming a second LDD region by implanting impurity ions having a second conductivity type different from the first conductivity type into the second active region at both sides of the second silicon pattern.

The method may also include forming a first source/drain region by implanting impurity ions having the first conductivity type into the first active region at both sides of the first silicon pattern, and/or forming a second source/drain region by implanting impurity ions having the second conductivity type into the second active region at both sides of the second silicon pattern.

Removing the sacrificial pattern may expose the top surface of the second silicon pattern at a lower level than the top surface of the second gate spacer.

The method may also include forming a first source/drain silicide in the first active region at both sides of the first silicon pattern, and/or forming a second source/drain silicide in the second active region at both sides of the second silicon pattern.

Forming the first and second gate suicides and the first and second source/drain suicides may include forming a metal layer on the semiconductor substrate, performing an annealing process on the semiconductor substrate and reacting the metal layer with the semiconductor substrate of the first active region, the semiconductor substrate of the second active region, the first silicon pattern and the second silicon pattern to form suicides, and/or removing unreacted portions of the metal layer.

The first and second gate silicides may include silicon and at least one of nickel (Ni), cobalt (Co), tungsten (W), tantalum (Ta), titanium (Ti), hafnium (Hf) and platinum (Pt).

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIGS. 3A through 3E are sectional views of a method of fabricating a semiconductor device according to another example embodiment.

DESCRIPTION OF EXAMPLE EMBODIMENTS

Figure 1A:
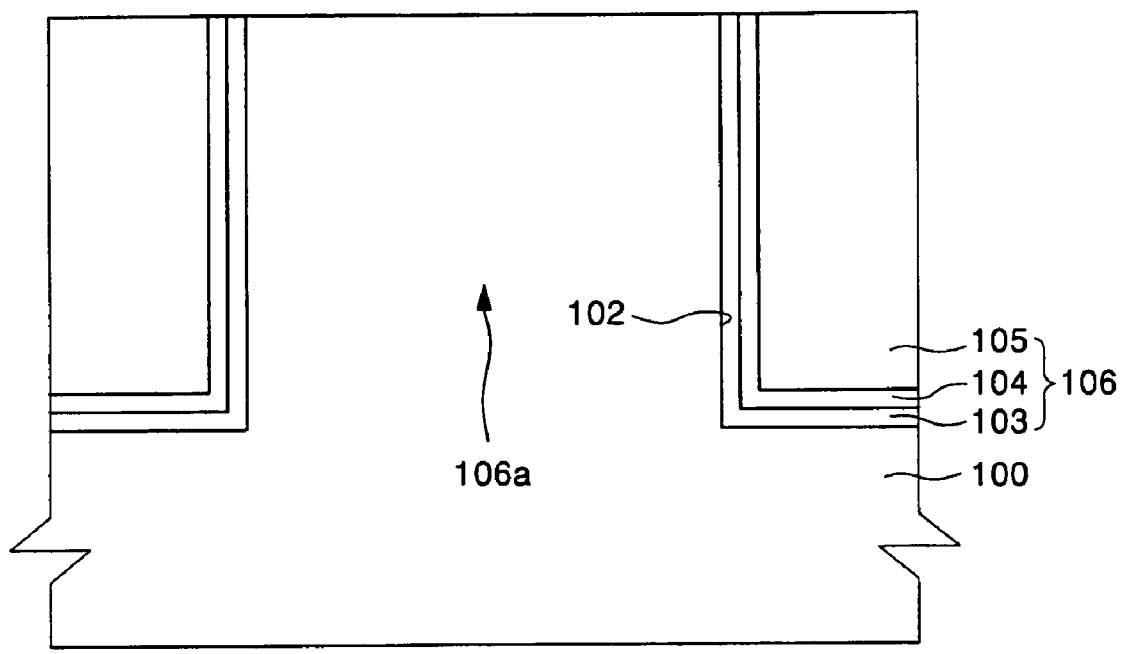
FIGS. 1A through 1G are sectional views of a method of fabricating a semiconductor device according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIGS. 1A through 1G are sectional views of a method of fabricating semiconductor devices according to an example embodiment.

FIG. 1A illustrates forming a semiconductor substrate 100. The semiconductor substrate may be a monocrystalline silicon substrate or the like, for example. A pad mask may be formed on the semiconductor substrate to expose a given region of the semiconductor substrate. The exposed semiconductor substrate may be anisotropically etched by using the pad mask as an etch mask to form a trench region 102 defining an active region 106a. The semiconductor substrate 100 having the trench region 102 may be thermally oxidized to form a buffer layer 103 including a thermal oxide layer on the surface of an inner wall of the trench region 102. The buffer layer 103 may be formed to recover etch damage which may occur on the semiconductor substrate 100 during the anisotropic etching process forming the trench region 102. An insulating liner 104 may be formed on the surface of the semiconductor substrate having the buffer layer 103. The insulating liner 104 may be formed of a silicon nitride layer or the like. The insulating liner 104 may be formed to prevent the inner wall of the trench region 102 from being additionally thermally oxidized while a subsequent annealing process is performed.

A trench insulating layer 105 may be formed on the insulating liner 104 to fill the trench region 102. The trench insulating layer 105 may be formed of a silicon oxide layer or the like. The trench insulating layer may be planarized to expose the top surface of the pad mask, and the pad mask may be removed. Therefore, an isolation layer 106 may be formed of the buffer layer 103 and the insulating liner 104, which may cover the surface of the inner wall of the trench region 102. The trench insulating layer 105 may be formed on the insulating liner 104 and fill the trench region 102.

Figure 1B:
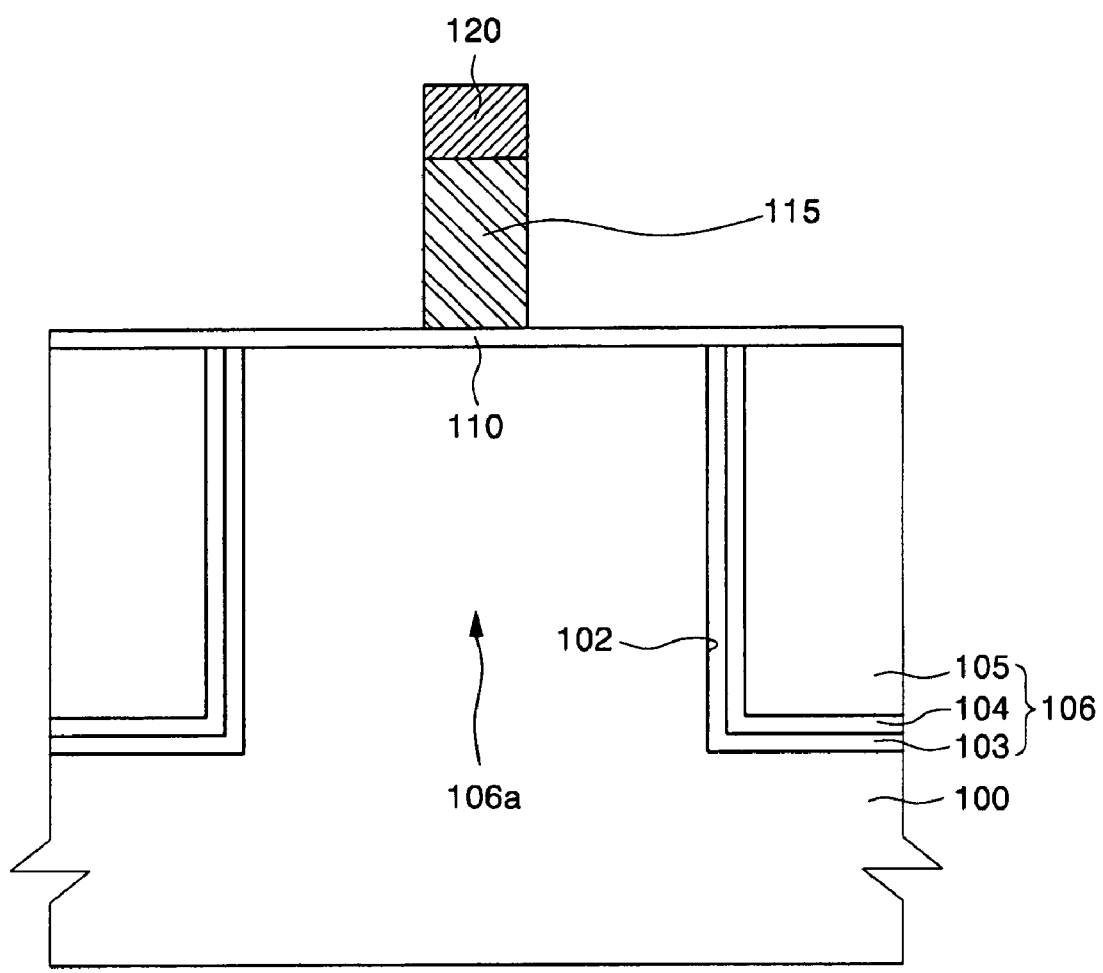

In FIG. 1B, a gate dielectric layer 110 may be formed on the semiconductor substrate 100 having the isolation layer 106. The gate dielectric layer 110 may be a thermal oxide layer or high-k dielectric layer, for example. A silicon layer and a sacrificial layer may be formed on the gate dielectric layer 110. For example, the silicon layer and the sacrificial layer may be formed sequentially. The silicon layer may be a doped polysilicon layer or the like. The sacrificial layer may be composed of a material having a higher etch selectivity with respect to the silicon layer and the isolation layer 106. The sacrificial layer may include a semiconductor material different from the silicon layer. The sacrificial layer may include germanium (Ge) elements or the like. For example, the sacrificial layer may be formed of a germanium (Ge) layer or a silicon germanium (SiGe) layer. The sacrificial layer may be formed by using a chemical vapor deposition method, an epitaxial growth technique, etc.

The sacrificial layer may include titanium (Ti) element and/or nitride (N) element. For example, the sacrificial layer may include a titanium (Ti) layer and/or titanium nitride (TiN) layer.

The sacrificial layer may be formed by sequentially stacking a first sacrificial layer and a second sacrificial layer. For example, the first sacrificial layer may be formed of a semiconductor material different from the silicon layer and the second sacrificial layer may be formed of a titanium (Ti) layer and/or titanium nitride (TiN) layer.

The sacrificial layer and the silicon layer may be patterned to form a silicon pattern 115 and a sacrificial pattern 120. For example, the silicon pattern 115 and the sacrificial pattern 120 may be formed sequentially.

Figure 1C:
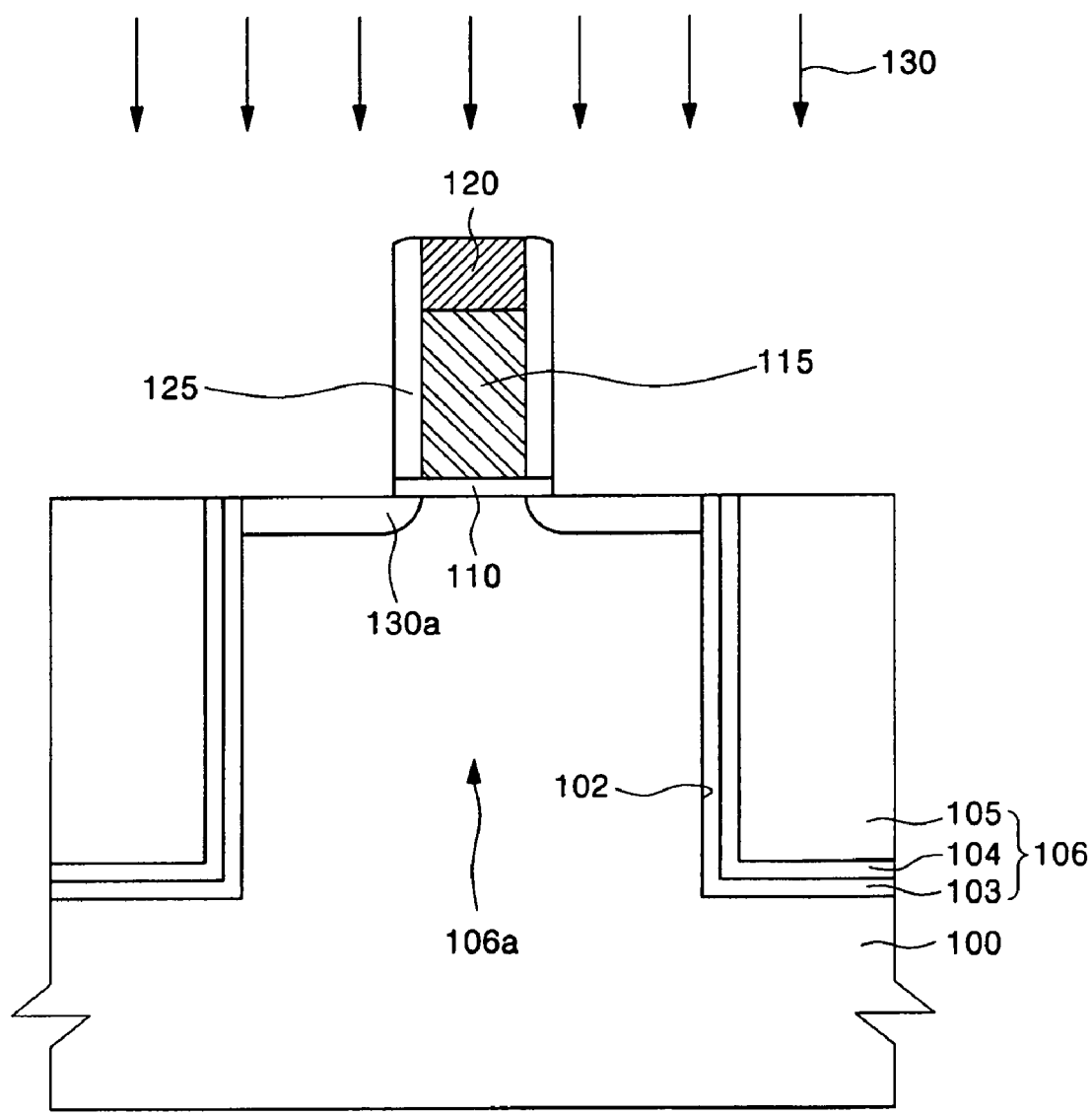

In FIG. 1C, an inside spacer 125 may be formed on a sidewall of the silicon pattern 115 and a sidewall of the sacrificial pattern 120. The inside spacer 125 may be composed of a material having a lower etch selectivity with respect to the sacrificial pattern 120. For example, the inside spacer 125 may be formed of a silicon oxide layer. The inside spacer 125 may be formed by thermal oxidation of the semiconductor substrate 100 on which the silicon pattern 115 and the sacrificial pattern 120 are formed. Thus, a thermal oxide layer may be formed on the exposed surfaces of the silicon pattern 115 and the sacrificial pattern 120, forming an insulating layer of silicon oxide using chemical vapor deposition and anisotropically etching the insulating layer and the thermal oxide layer. The insulating layer may be formed of a low temperature oxide (LTO) layer or a medium temperature oxide (MTO) layer, or the like.

The gate dielectric layer 110 may be partially etched while the inside spacer 125 is formed.

A lightly doped drain (LDD) region 130a may be formed by implanting first impurity ions 130 into the active region 106a, using the sacrificial pattern 120, the inside spacer 125 and the isolation layer 106 as a mask for ion implantation. The LDD region 130a may be an n-type or a p-type.

Figure 1D:
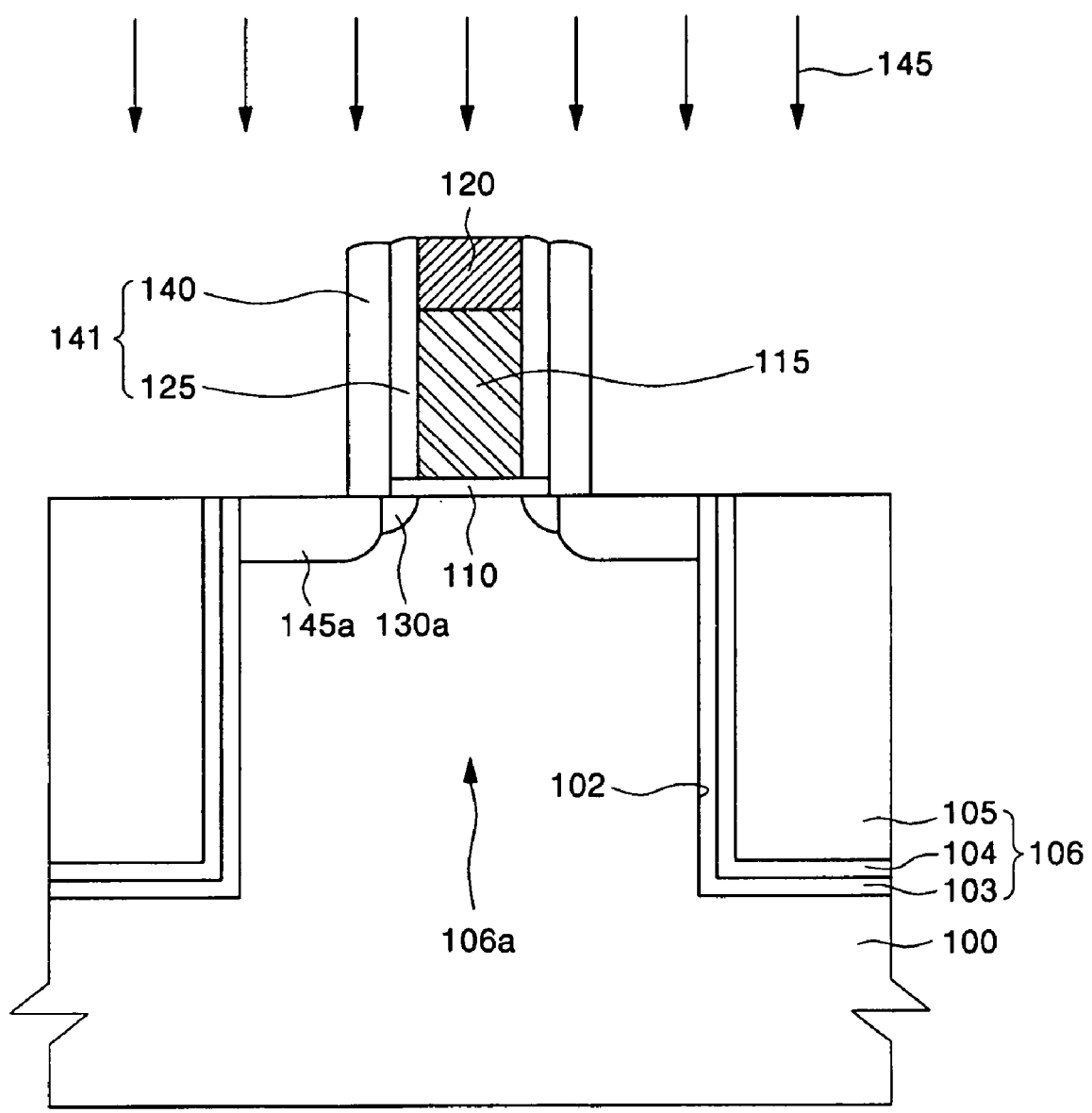

In FIG. 1D, a spacer insulating layer may be formed on the semiconductor substrate having the inside spacer 125 by using chemical vapor deposition or the like. The spacer insulating layer may be composed of a material having a lower etch selectivity with respect to the sacrificial pattern 120. For example, the spacer insulating layer may be formed of a silicon nitride layer.

Before the spacer insulating layer is formed, a thermal oxide layer may be formed on the exposed surface of the active region 106a, by thermal oxidation of the semiconductor substrate having the inside spacer 125.

The spacer insulating layer may be anisotropically etched to form an outside spacer 140 covering the outside of the inside spacer 125. The inside spacer 125 and the outside spacer 140 may form a gate spacer 141.

A source/drain region 145a may be formed by implanting second impurity ions 145 into the active region 106 using the gate spacer 141, the sacrificial pattern 120 and/or the isolation layer 106 as the mask for ion implantation. The source/drain region 145a may have the same type of conductivity as the LDD region 130a. Thus, a MOS transistor may be formed.

Figure 1E:
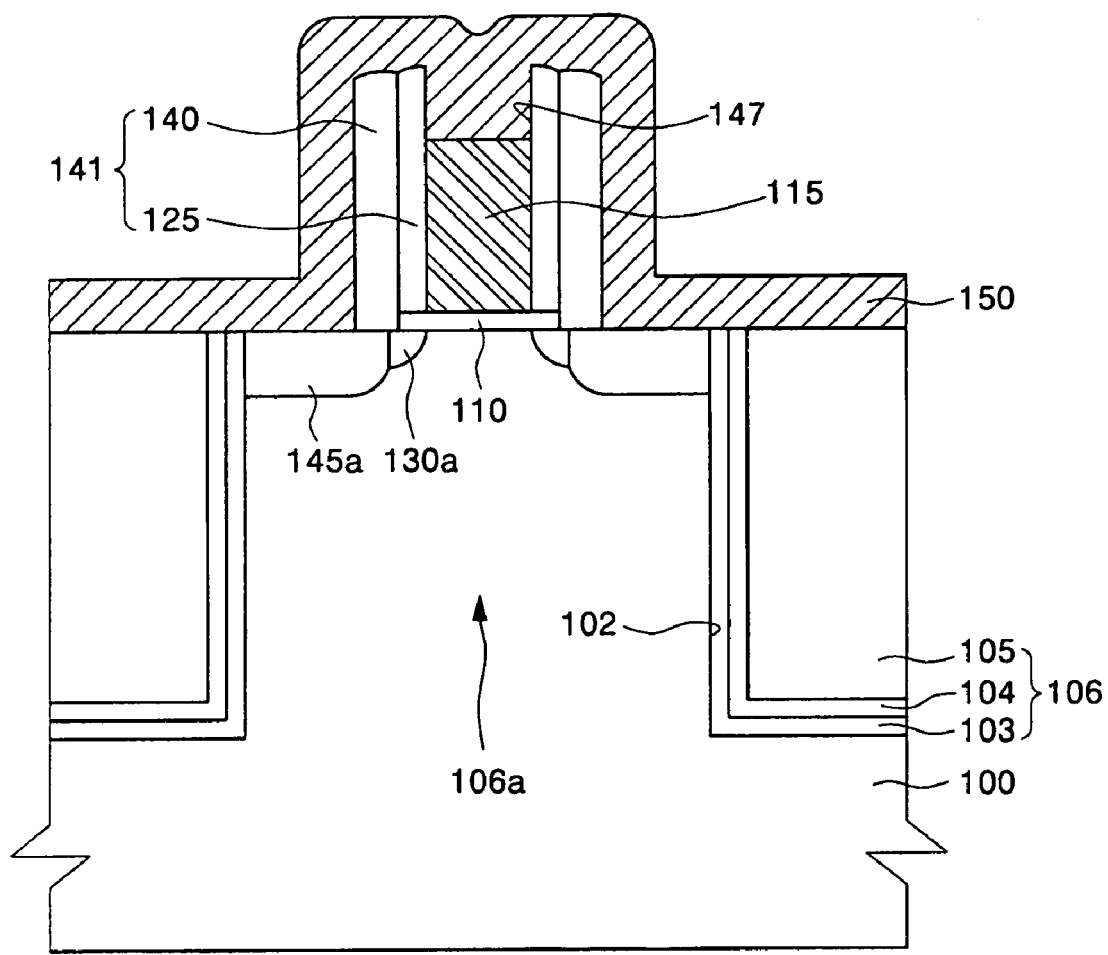

In FIG. 1E, the sacrificial pattern (120 of FIG. 1D) may be removed to form an opening 147 exposing the top surface of the silicon pattern 115. Because the sacrificial pattern (120 of FIG. 1D) is composed of a material having a higher etching selectivity with respect to the silicon pattern 115, the isolation layer 106 and the gate spacer 141, the sacrificial pattern (120 of FIG. 1D) may be selectively removed. As a result, the top surface of the silicon pattern 115 may be positioned at a lower level than the top surface of the gate spacer 141. Further, while the sacrificial pattern (120 of FIG. 1D) is removed, the isolation layer 106 may be etched to be inhibited or prevented from being recessed.

The surface of the semiconductor substrate having the opening 147 may be cleaned to remove a native oxide layer and contaminated particles remaining on the exposed surface of the source/drain region 145a and the exposed surface of the silicon pattern 115. For example, the cleaning process may use a wet cleaning solution containing a hydrofluoric (HF) acid, followed by a mixture solution of ammonium hydroxide ($NH_4OH$), hydrogen peroxide ($H_2O_2$) and water ($H_2O$).

A metal layer 150 may be formed on the semiconductor substrate having the opening 147. The metal layer 150 may be formed to fill the opening 147. Otherwise, the metal layer 150 may be formed to have a uniform thickness along an inner wall of the opening 147. The metal layer 150 may include a nickel (Ni) element, a cobalt (Co) element, a tungsten (W) element, a tantalum (Ta) element, a titanium (Ti) element, a hafnium (Hf) element, and/or a platinum (Pt) element, or the like.

A capping layer (not shown) may be formed on the metal layer 150. The capping layer may be formed of a titanium nitride layer. For example, the titanium nitride layer may prevent the metal layer 150 from being oxidized. However, the formation of the capping layer may be omitted.

Figure 1F:
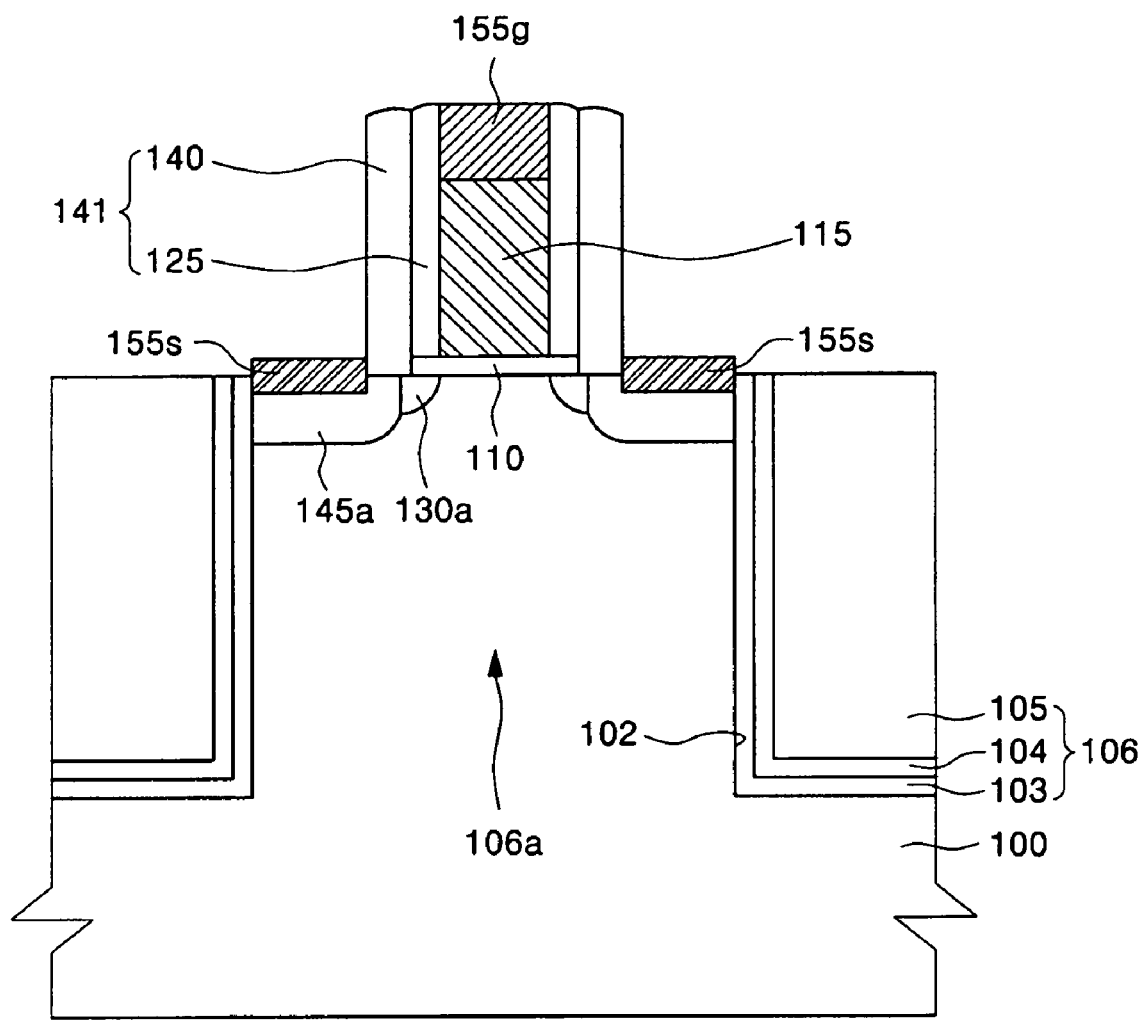

In FIG. 1F, an annealing process may be performed on the semiconductor substrate having the metal layer (150 of FIG. 1E) to react the silicon pattern 115 with the metal layer (150 of FIG. 1E) so as to form a gate silicide 155g, and to react the semiconductor substrate 100 of the active region 106a with the metal layer (150 of FIG. 1E) so as to form a source/drain silicide 155s. For example, the gate silicide 155g may be formed on the silicon pattern 115 and the source/drain silicide 155s may be formed on the source/drain region 145a. The gate silicide 155g and the source/drain silicide 155s may include Ni, Co, W, Ta, Ti, Hf and/or Pt elements, or the like, and a silicon element.

The annealing process to form the gate silicide 155g and the source/drain silicide 155s may be performed at a temperature of about 400° C. to about 500° C. when the metal layer (150 of FIG. 1E) is a nickel layer including a Ni element. The annealing process may be performed by a first and second anneal, for example. Portions of the metal layer (150 of FIG. 1E) unreacted by the annealing process may be removed.

The gate silicide 155g may be formed at a uniform thickness with a flat bottom surface. Therefore, a resistance distribution characteristic of the gate silicide 155g may be improved.

Since the top surface of the gate spacer 141 is positioned at a higher level than the top surface of the silicon pattern 115 as described above, the gate silicide 155g may be inhibited or prevented from excessively growing. For example, the gate silicide 155g may be formed to having substantially the same width as the silicon pattern 115. Therefore, electrical shorts may be prevented from occurring between the gate silicide 155g and other adjacent gate silicides.

In forming the opening 147 to expose the top surface of the silicon pattern 115 by removing the sacrificial pattern (120 of FIG. 1D) described with reference to FIG. 1E, even though the sacrificial pattern (120 of FIG. 1D) may not be completely removed, the gate silicide 155g may be formed because the material forming the sacrificial pattern (120 of FIG. 1D) may not obstruct the silicide formation. For example, since the sacrificial pattern (120 of FIG. 1D) may be a germanium layer or silicon germanium layer including a germanium element, the metal layer (150 of FIG. 1E) may react with the sacrificial pattern (120 of FIG. 1D) by the annealing process to form silicide. Therefore, even though the sacrificial pattern (120 of FIG. 1D) may not be completely removed, deterioration of electrical resistance characteristics of the gate electrode may be reduced or prevented.

Figure 1G:
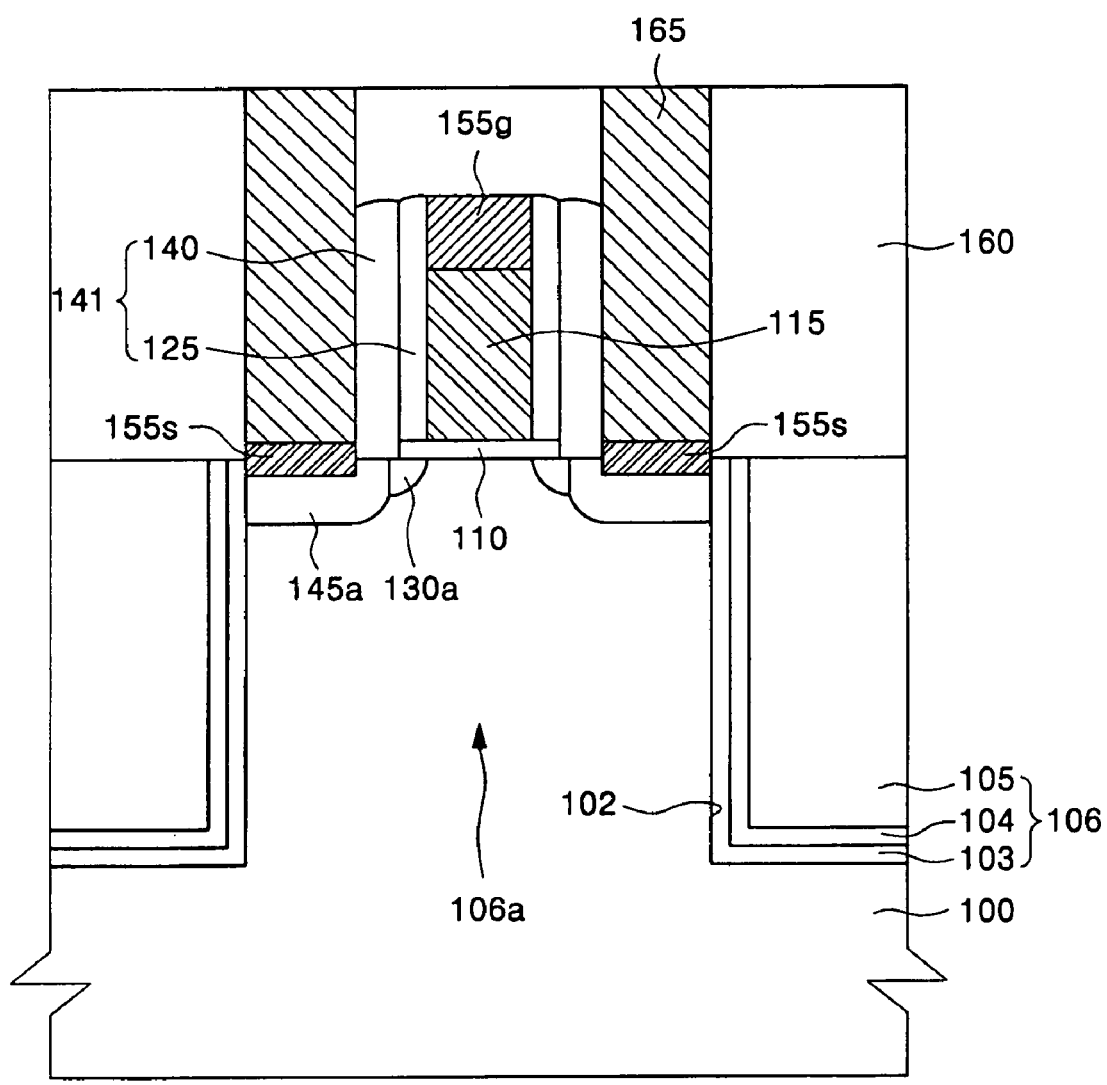

In FIG. 1G, an interlayer insulating layer 160 may be formed on the semiconductor substrate having the gate silicide 155g and the source/drain silicide 155s. The interlayer insulating layer 160 may be formed of a silicon oxide layer or the like. A contact structure 165 may be formed to pass through the interlayer insulating layer 160 and in electrical contact with the source/drain silicide 155s. Because the gate silicide 155g and the silicon pattern 115 may be formed having substantially the same width, an electrical short between the gate silicide 155g and the contact structure 165 may be prevented.

FIGS. 2A through 2D are sectional views of a method of fabricating semiconductor devices according to another example embodiment.

Figure 2A:
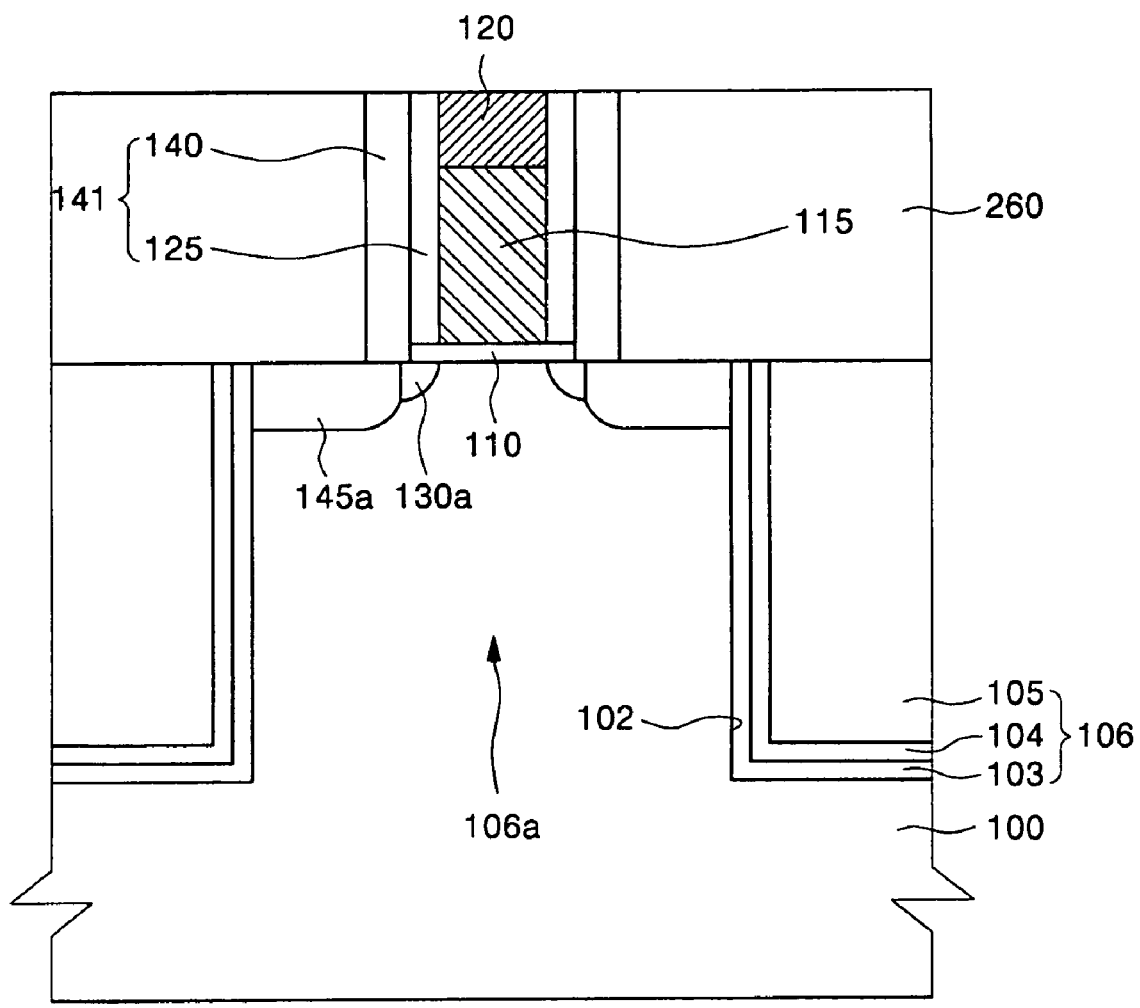
FIGS. 2A through 2D are sectional views of a method of fabricating a semiconductor device according to another example embodiment.

In FIG. 2A, a MOS transistor may be formed using similar processes to those described above with reference to FIGS. 1A through 1D. An insulating mask layer may be formed on the surface of the semiconductor substrate having the MOS transistor. The insulating mask layer may be formed of an insulating layer having a lower etching selectivity with respect to the sacrificial pattern 120. For example, the insulating mask layer may be formed of a silicon oxide layer or the like. The insulating mask layer may be planarized to form a mask pattern 260 exposing the sacrificial pattern 120. As a result, at least the source/drain region 145a may be covered by the mask pattern 260.

Figure 2B:
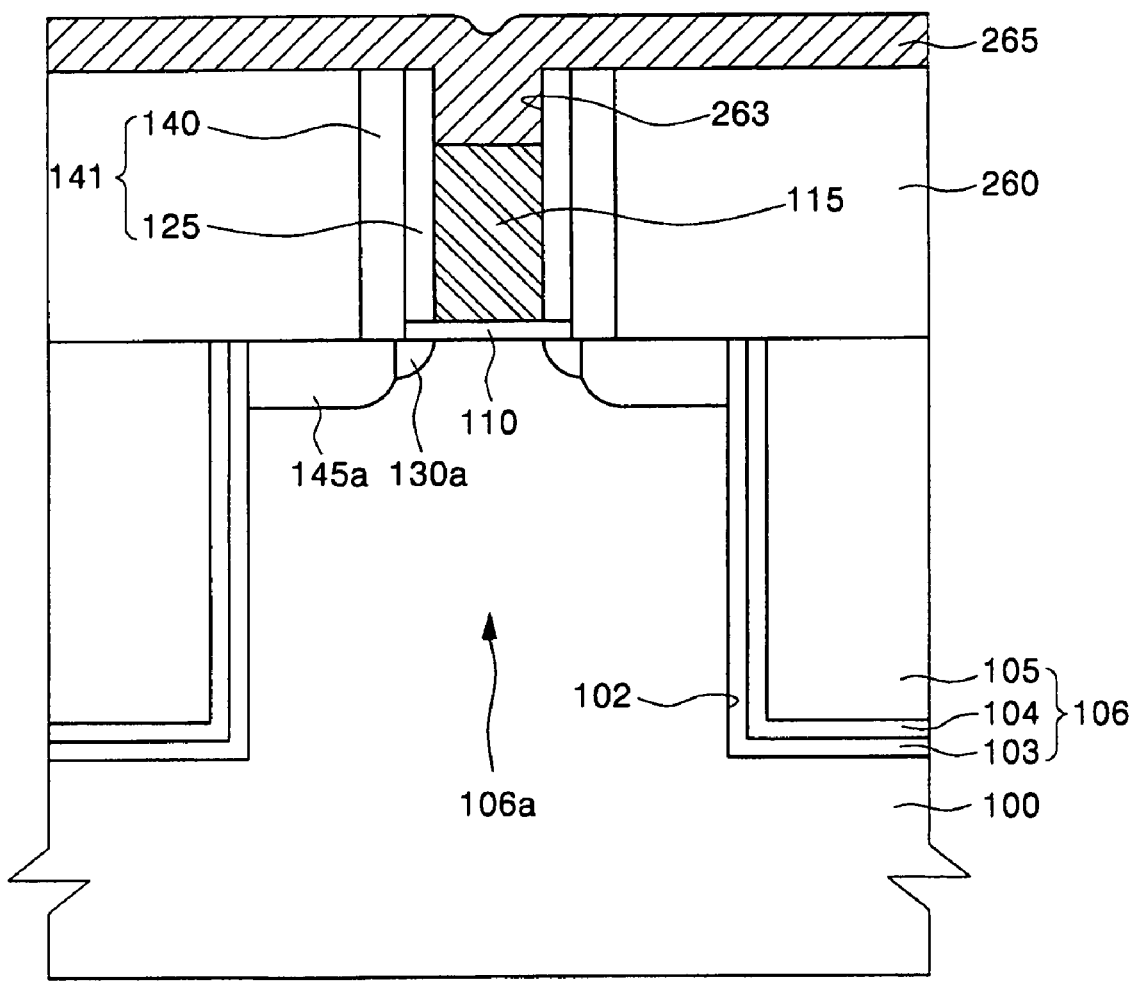

In FIG. 2B, the sacrificial pattern (120 of FIG. 2A) may be removed to form an opening 263 exposing the silicon pattern 115. As a result, the top surface of the silicon pattern 115 exposed by the opening 263 may be positioned at a lower level than the top surface of the gate spacer 263.

A metal layer 265 may be formed on the semiconductor substrate having the opening 263. The metal layer 265 may be formed to fill the opening 263. Otherwise, the metal layer 265 may be formed to a uniform thickness, along the surface of an inner wall of the opening 263. The metal layer 265 may be include Ni, Co, W, Ta, Ti, Hf and/or Pt elements, or the like.

A capping layer (not shown) may be formed on the metal layer 265. The capping layer may be formed of a titanium nitride layer, for example. The titanium nitride layer may reduce or prevent oxidation of the metal layer 265.

Figure 2C:
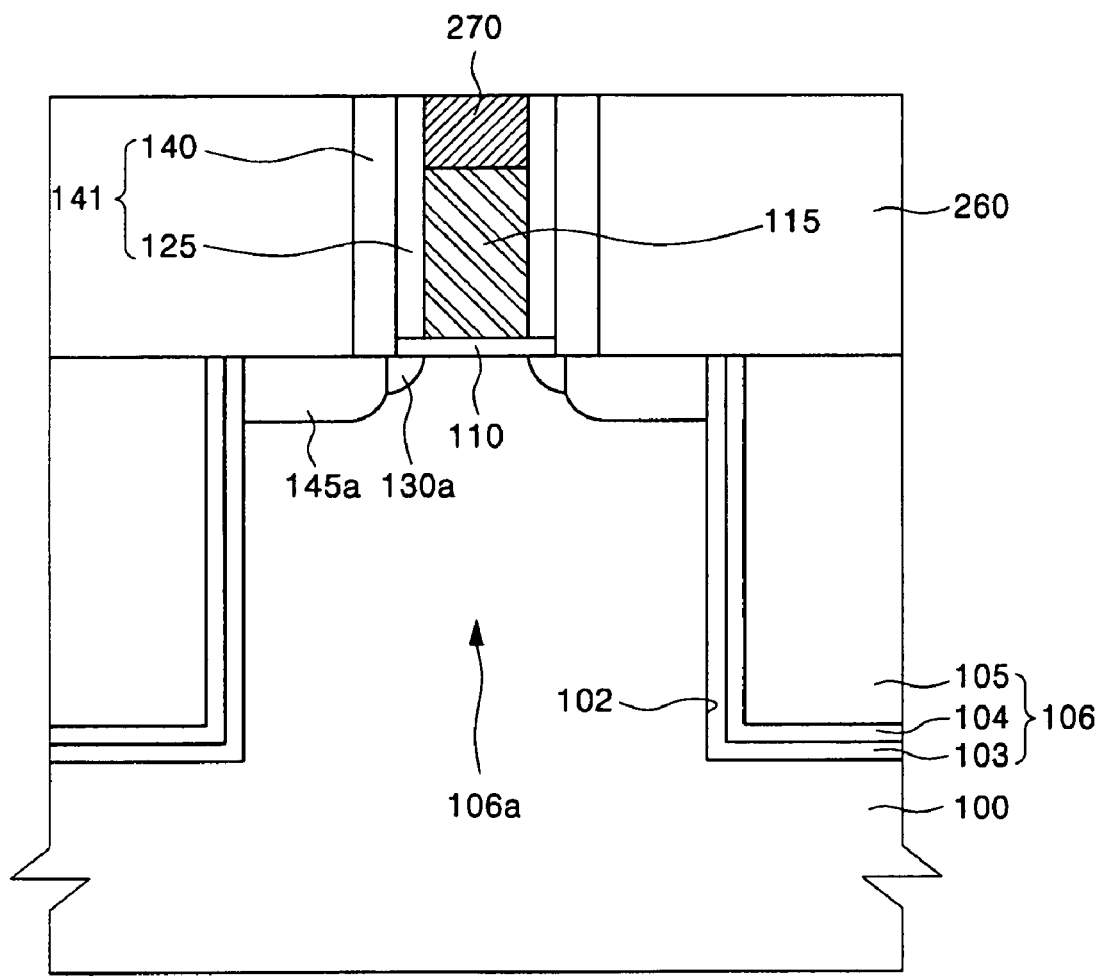

In FIG. 2C, an annealing process may be performed on the semiconductor substrate having the metal layer (265 of FIG. 2B). As a result, a metal element of the metal layer (265 of FIG. 2B) may react with the silicon element of the silicon pattern 115 to form a gate silicide 270. Therefore, the gate silicide 270 may include Ni, Co, W, Ta, Ti, Hf and/or Pt elements and the silicon element. Unreacted portions of the metal layer (265 of FIG. 2B) may be removed.

The gate silicide 270 may be formed at a desired thickness because the thickness of the sacrificial pattern (120 of FIG. 2A) may be controllable, and thus the opening (263 of FIG. 2B) may be formed at a desired depth. Therefore, the metal layer (265 of FIG. 2B), which may be formed on the silicon pattern 115 exposed by the opening (263 of FIG. 2B), may be formed to a desired thickness. As a result, the gate silicide 270 may be formed to have substantially the same width as the silicon pattern 115, and the thickness of the gate silicide 270 may be increased.

Figure 2D:
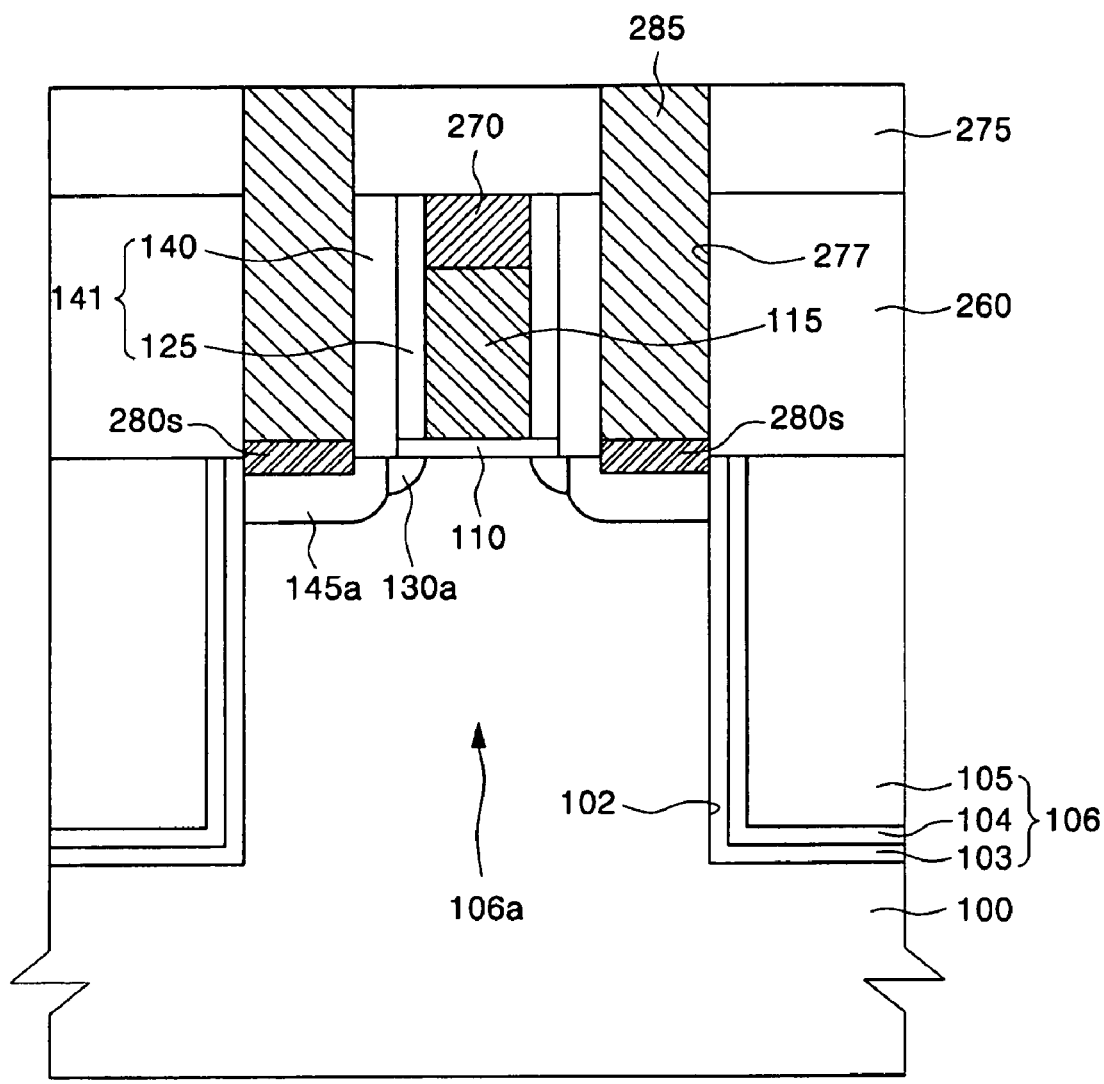

In FIG. 2D, an interlayer insulating layer 275 may be formed on the semiconductor substrate having the gate silicide 270. The interlayer insulating layer 275 may be formed of a silicon oxide layer or the like. A contact hole 277 may be formed to pass through the interlayer insulating layer 275 and the mask pattern 260 and expose the source/drain region 145a. A source/drain silicide 280s may be formed in the source/drain region 145a exposed by the contact hole 277. A contact structure 285 may be formed to fill the contact hole 277.

The source/drain silicide 280s may be formed to a desired thickness because the amount of metal material, which is one of the factors determining the thickness of a silicide, may be controllable. For example, the metal layer, which may be formed on the source/drain region 145a exposed by the contact hole 277, may be formed to a desired thickness. Therefore, because the source/drain silicide 280s may be formed to a relatively thin thickness, the source/drain region 145a may be formed in a shallow junction structure. Consequently, because the source/drain region 145a may be formed in the shallow junction structure and the thickness of the gate silicide 270 forming the gate electrode of the MOS transistor may be increased, transmission speed of an electrical signal applied to the gate electrode may be increased. Further, since the gate silicide 270 may be formed to have substantially the same width as the silicon pattern 115, an electrical short between the gate silicide 270 and the contact structure 285 may be prevented.

FIGS. 3A through 3E are sectional views of a method of fabricating semiconductor devices according to another example embodiment.

In FIG. 3A, a semiconductor substrate 300 having a first transistor region N and a second transistor region P may be prepared. The first transistor region N may be an NMOS transistor region and the second transistor region P may be a PMOS transistor region. Or, the first transistor region N may be a lower-voltage transistor region and the second transistor region P may be a higher-voltage transistor region. The semiconductor substrate 300 may be a monocrystalline silicon substrate or the like, for example. An isolation layer 306s defining a first active region 306a and a second active region 306b may be formed in the semiconductor substrate 300 by a similar process as described above with reference to FIG. 1A. For example, the isolation layer 306s may be formed in the semiconductor substrate 300 to define the first active region 306a in the first transistor region N and the second active region 306b in the second transistor region P. The first active region 306a and the second active region 306b may have a different conductivity type from each other. For example, the first active region 306a may be an active region of an NMOS transistor and the second active region 306b may be an active region of a PMOS transistor.

The forming of the isolation layer 306s may include forming a trench region 302 by etching a given region of the semiconductor substrate 300, forming a buffer layer 303 and an insulating liner 304 on the surface of an inner wall of the trench region 302, and/or forming a trench insulating layer 305 on the insulating liner 304 to fill the trench region 302. For example, the buffer layer 303 and the insulating liner 304 may be formed sequentially.

A gate dielectric layer 310 and a silicon layer 315 may be formed on the semiconductor substrate having the isolation layer 306s. For example, the gate dielectric layer 310 and the silicon layer 315 may be formed sequentially. The gate dielectric layer 310 may be formed of a thermal oxide layer or a high-k dielectric layer, or the like. The silicon layer 315 may be a doped polysilicon layer. For example, the silicon layer 315 may be a polysilicon layer doped as n-type or p-type.

The gate dielectric layer 310 may be formed at different equivalent oxide thicknesses in the first transistor region N and the second transistor region P. For example, when the first transistor region N is the lower-voltage transistor region and the second transistor region P is the higher-voltage transistor region, the gate dielectric layer 310 may have a greater equivalent oxide thickness in the higher-voltage transistor region than the lower-voltage transistor region.

A sacrificial layer 320 may be formed on the silicon layer 315 in the second active region 306b. The sacrificial layer 320 may be composed of a material having a higher etch selectivity with respect to the silicon layer 315 and the isolation layer 306s. The sacrificial layer 320 may include a semiconductor material different from the silicon layer. The sacrificial layer 320 may include a germanium (Ge) element. For example, the sacrificial layer 320 may be formed of a germanium (Ge) layer or a silicon germanium (SiGe) layer. The sacrificial layer 320 may be formed by using chemical vapor deposition or epitaxial growth, or the like.

The sacrificial layer 320 may include titanium (Ti) element and/or nitride (N) element. For example, the sacrificial layer may include a titanium (Ti) layer and/or titanium nitride (TiN) layer.

The sacrificial layer 320 may be formed by sequentially stacking a first sacrificial layer and a second sacrificial layer. For example, the first sacrificial layer may be formed of a semiconductor material different from the silicon layer and the second sacrificial layer may be formed of a titanium (Ti) layer and/or titanium nitride (TiN) layer.

The forming of the sacrificial layer 320 may include forming a material layer including a germanium element on the semiconductor substrate having the silicon layer 315, and/or patterning the material layer to remain on the silicon layer 315 in the second active region 306b. Alternatively, the forming of the sacrificial layer 320 may include forming a hard mask on the silicon layer 315 in the first active region 306a, exposing the silicon layer 315 in the second active region 306b, growing a material layer including a germanium element on the exposed silicon layer 315 in the second active region 306b by epitaxial growth, and/or removing the hard mask.

Figure 3B:
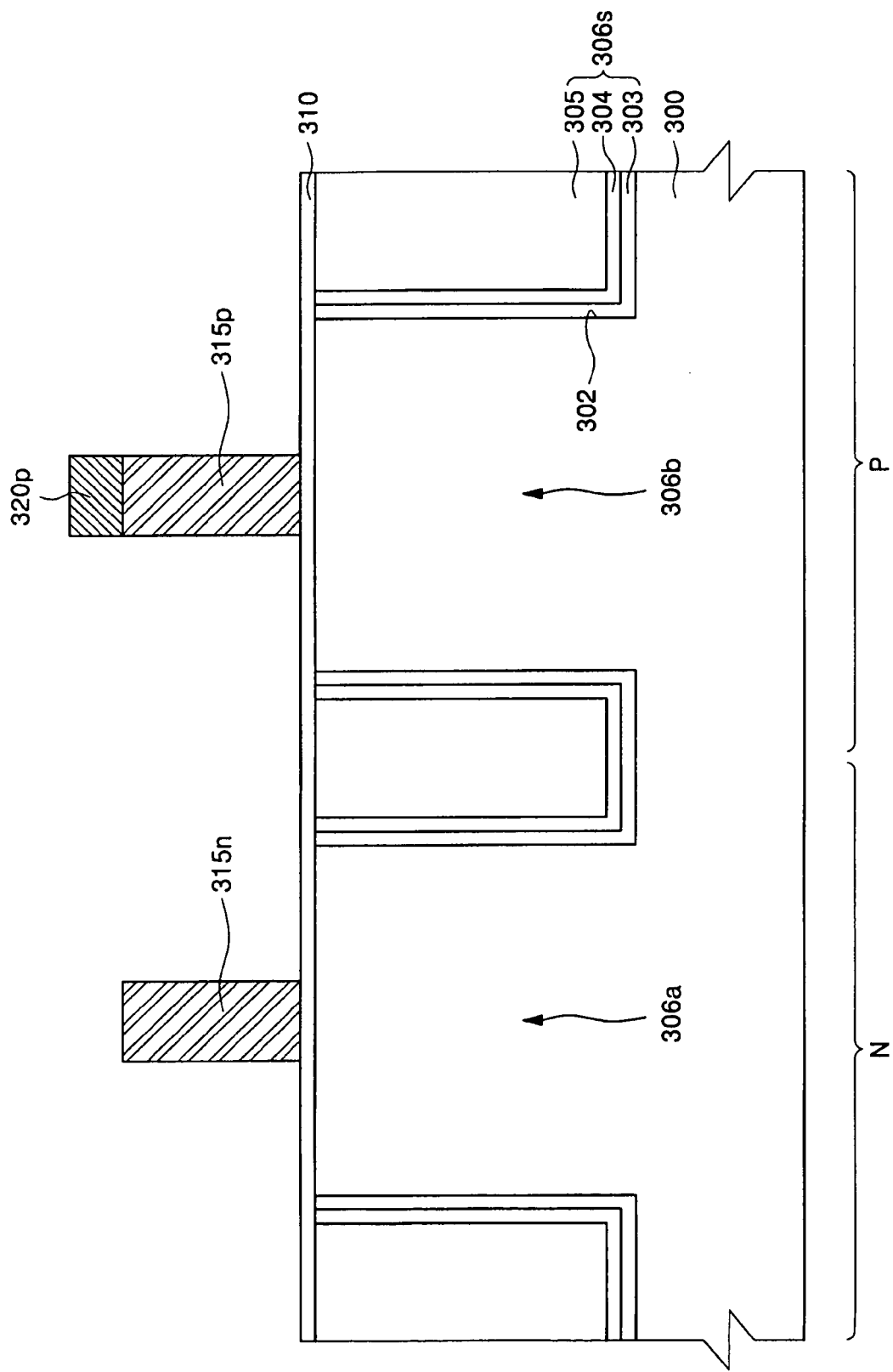

In FIG. 3B, the silicon layer 315 in the first transistor region N may be patterned to form a first silicon pattern 315n in the first active region 306a. The silicon layer 315 and the sacrificial layer 320 formed in the second transistor region P may be patterned to form a second silicon pattern 315p and a sacrificial pattern 320p, respectively, in the second active region 306b.

In FIG. 3C, MOS transistors may be formed using similar processes as described above with reference to FIGS. 1C and 1D. For example, a first inside spacer 325n may be formed on a sidewall of the first silicon pattern 315n. A second inside spacer 325p may be formed on a sidewall of the second silicon pattern 315p and a sidewall of the sacrificial pattern 320p. While the first and second inside spacers 325n and 325p are formed, the gate dielectric layer 310 may be etched to form a first gate dielectric layer 310n remaining under the first silicon pattern 315n, and a second gate dielectric layer 310p remaining under the second silicon pattern 315p.

A first LDD region 330n may be formed by forming a first photoresist pattern covering the second transistor region P and implanting impurity ions into the first active region 306a using the first photoresist pattern, the isolation layer 306s, the first inside spacer 325n and the first silicon pattern 315n as a mask for ion implantation. The first LDD region 330n may have a different type of conductivity from the first active region 306a. The first photoresist pattern may be removed. Similarly, a second LDD region 330p may be formed by forming a second photoresist pattern covering the first transistor region N and implanting the impurity ions into the second active region 306b using the second photoresist pattern, the isolation layer 306s, the second inside spacer 325p and the sacrificial pattern 320p as a mask for ion implantation. The second LDD region 330p may have a different type of conductivity from the second active region 306b. The second photoresist pattern may be removed.

A spacer insulating layer may be formed on the semiconductor substrate having the first and second spacers 325n and 325p by using chemical vapor deposition or the like. The spacer insulating layer may be anisotropically etched to form a first outside spacer 340n outside the first inside spacer 325n and a second outside spacer 340p outside the second inside spacer 325p. The first inside spacer 325n and the first outside spacer 340n may form a first gate spacer 341n. The second inside spacer 325p and the second outside spacer 340p may form a second gate spacer 341p. The first and second gate spacers 341n and 341p may have a lower etch selectivity with respect to the sacrificial pattern 320p.

A first source/drain region 345n may be formed by forming a third photoresist pattern covering the second transistor region P and implanting impurity ions having a first conductivity type into the first active region 306a by using the third photoresist pattern, the isolation layer 306s, the first gate spacer 341n and/or the first silicon pattern 315n as a mask for ion implantation. The third photoresist pattern may be removed. The impurity ions having the first conductivity type may be implanted into the first silicon pattern 315n. Thus, the first silicon pattern 315n may have a first conductivity type. When the first transistor region N is an NMOS transistor region, the first conductivity type may be n-type. Meanwhile, a second source/drain region 345p may be formed in the second active region 306b by forming a fourth photoresist pattern covering the first transistor region N and using the fourth photoresist pattern, the isolation layer 306s, the second gate spacer 341p and/or the sacrificial pattern 320p as a mask for ion implantation. The fourth photoresist pattern may be removed.

Because the first silicon pattern 315n has an n-type conductivity, when the silicon layer 315 described with reference to FIG. 3A has a p-type conductivity, a gate electrode having an n-type conductivity may be formed in the first transistor region N and a gate electrode having a p-type conductivity may be formed in the second transistor region P. Therefore, a CMOS transistor having dual gate electrodes may be used to control threshold voltages of the NMOS transistor and the PMOS transistor.

Figure 3D:
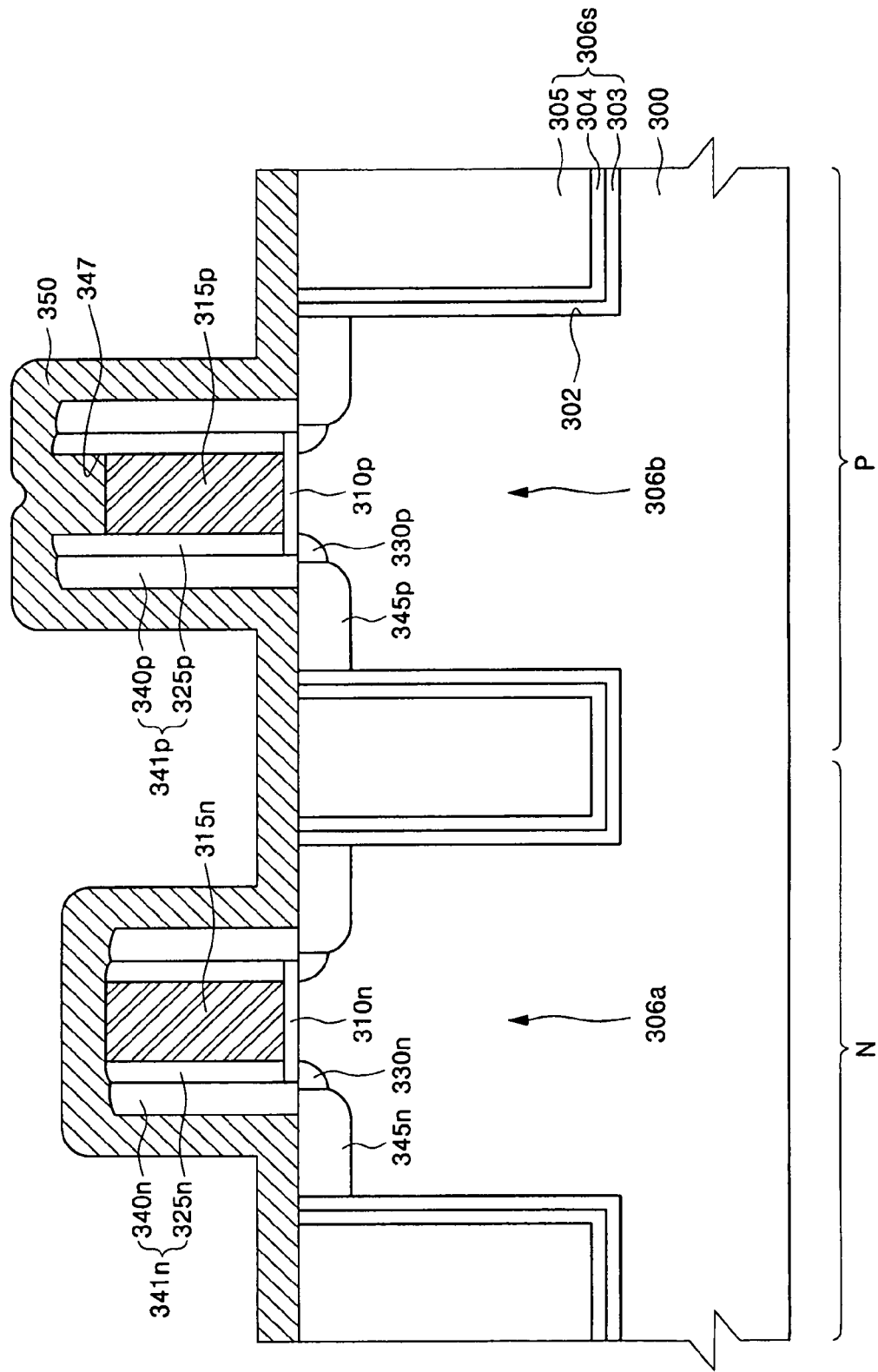

In FIG. 3D, the sacrificial pattern (320p of FIG. 3C) may be removed to form an opening 347 exposing the top surface of the second silicon pattern 315p. Because the sacrificial pattern (320p of FIG. 3C) is composed of a material having a higher etch selectivity with respect to the isolation layer 306s, the first silicon pattern 315n, and the second silicon pattern 315p, the first gate spacer 341n, and the second gate spacer 341p, the sacrificial pattern (320p of FIG. 3C) may be selectively removed. Therefore, the top surface of the second gate spacer 341p may be higher than the top surface of the second silicon pattern 315p. A metal layer 350 may be formed on the semiconductor substrate having the opening 347 by a similar process as described above with reference to FIG. 1E. The metal layer 350 may be thicker on the second silicon pattern 315p than on the first silicon pattern 315n because the metal layer 350 may be formed to fill the opening 347 when a width of the opening 347 is narrow, even though the metal layer 350 may be formed at a uniform thickness.

Figure 3E:
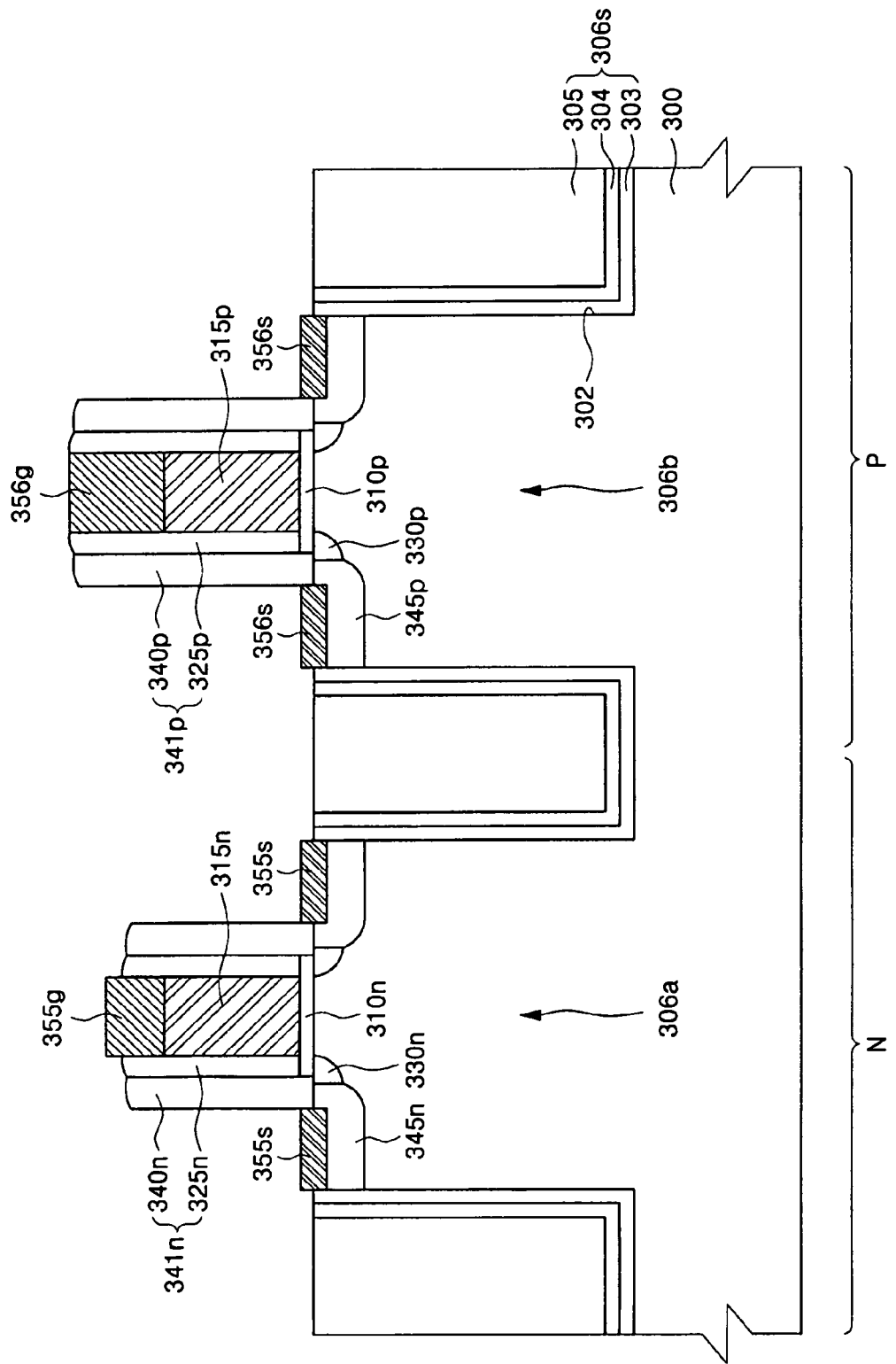

In FIG. 3E, an annealing process may be performed on the semiconductor substrate having the metal layer (350 of FIG. 3D) by a similar process as described above with reference to FIG. 1F. Thus, a first gate silicide 355g may be formed on the first silicon pattern 315n, a first source/drain silicide 355s may be formed in the first source/drain region 345n, a second gate silicide 356g may be formed on the second silicon pattern 315p, and/or a second source/drain silicide 356s may be formed in the second source/drain region 345p. Unreacted portions of the metal layer (350 of FIG. 3D) may be removed.

An interlayer insulating layer (not shown) and a contact structure (not shown) may be formed on the semiconductor substrate having the first and second gate silicides 355g and 356g and the first and second source/drain silicides 355s and 356s by a similar process as described above with reference to FIG. 1F.

The first gate silicide 355g and the second gate silicide 356g may be formed having different thicknesses from each other. Because the thickness of the metal layer (350 of FIG. 3F), which is one of the factors determining the thickness of silicide, may be formed thicker on the second silicon pattern 315p than on the first silicon pattern 315n, the second gate silicide 356g may be formed thicker than the first gate silicide 355g. Therefore, because the first gate silicide 355g may be hindered or prevented from growing excessively, an electrical short may be prevented between the first gate silicide 355g and the contact structure. Further, even though the second gate silicide 356g may be formed thicker, because the second gate silicide 356g may be formed having substantially the same width as the second silicon pattern 315p, the electrical short between the second gate silicide 356g and the contact structure may be prevented.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of fabricating a semiconductor device, comprising:
   forming an isolation layer defining an active region in a semiconductor substrate;
   forming a silicon pattern and a sacrificial pattern on the active region, the sacrificial pattern including a semiconductor material different from the silicon pattern;
   forming an inside spacer on a sidewall of the silicon pattern and a sidewall of the sacrificial pattern;
   forming a lightly doped drain (LDD) region by implanting first impurity ions into the active region using at least one of the sacrificial pattern, the inside spacer and the isolation layer as a mask for ion implantation;
   forming a spacer insulating layer on the semiconductor by using a chemical vapor deposition method;
   anisotropically etching the spacer insulating layer to form an outside spacer;
   removing the sacrificial pattern to expose a top surface of the silicon pattern; and
   forming a gate silicide on the silicon pattern.

2. The method according to claim 1, wherein the sacrificial pattern including germanium (Ge).

3. The method according to claim 1, wherein the sacrificial pattern is formed of a germanium layer or a silicon germanium layer.

4. The method according to claim 1, further comprising:
   forming a source/drain region by implanting second impurity ions into the active region using at least one of the sacrificial pattern, the gate spacer and the isolation layer as a mask for ion implantation.

5. The method according to claim 1, wherein removing the sacrificial pattern exposes the top surface of the silicon pattern at a lower level than the top surface of the gate spacer.

6. The method according to claim 1, further comprising:
   forming a source/drain silicide in the active region at both sides of the silicon pattern.

7. The method according to claim 6, wherein forming the gate silicide and the source/drain silicide includes:
   forming a metal layer on the semiconductor substrate;
   forming silicides by performing an annealing process on the semiconductor substrate to react the metal layer and the silicon pattern; and
   removing unreacted portions of the metal layer.

8. A method of fabricating a semiconductor device, comprising:
  forming an isolation layer defining an active region in a semiconductor substrate;
  forming a silicon pattern and a sacrificial pattern on the active region, the sacrificial pattern including a semiconductor material different from the silicon pattern;
  forming a gate spacer on a sidewall of the silicon pattern and a sidewall of the sacrificial pattern;
  removing the sacrificial pattern to expose a top surface of the silicon pattern;
  forming a gate silicide on the silicon pattern;
  forming an insulating mask layer on the semiconductor substrate;
  forming a mask pattern by planarizing the insulating mask layer until the top surface of the sacrificial pattern is exposed;
  forming an interlayer insulating layer on the semiconductor substrate;
  forming a contact hole passing through the interlayer insulating layer and the mask pattern to expose the active region on both sides of the silicon pattern; and
  forming a source/drain silicide in the active region exposed by the contact hole.

9. The method according to claim 1, wherein the gate silicide includes silicon and at least one of nickel (Ni), cobalt (Go), tungsten (W), tantalum (Ta), titanium (Ti), hafnium (Hf) and platinum (Pt).

10. A method of fabricating a semiconductor device, comprising:
  forming an isolation layer defining a first active region and a second active region in a semiconductor substrate;
  forming a silicon layer on the first and second active regions;
  forming a sacrificial layer on the silicon layer on the first and second active regions, the sacrificial layer including a semiconductor material different from that of the silicon layer;
  patterning the sacrificial layer to remain on the silicon layer in the second active region;
  forming a first silicon pattern in the first active region by patterning the silicon layer in the first active region and forming a second silicon pattern and a sacrificial pattern in the second active region by patterning the silicon layer and the remaining sacrificial layer in the second active region;
  forming a first gate spacer on a sidewall of the first silicon pattern and forming a second gate spacer on a sidewall of the second silicon pattern and a sidewall of the sacrificial pattern;
  removing the sacrificial pattern to expose a top surface of the second silicon pattern; and
  forming a first gate silicide on the first silicon pattern and forming a second gate silicide on the second silicon pattern.

11. The method according to claim 10, wherein the first active region is an active region of an NMOS transistor and the second active region is an active region of a PMOS transistor.

12. A method of fabricating a semiconductor device, comprising:
  forming an isolation layer defining a first active region and a second active region in a semiconductor substrate;
  forming a silicon layer on the first active region and the second active region;
  forming a hard mask on the silicon layer formed on the first active region to expose the silicon layer formed on the second active region;
  forming a sacrificial layer on the silicon layer on the second active region using an epitaxial growth technique;
  removing the hard mask;
  patterning the silicon layer formed on the first active region to form a first silicon pattern in the first active region and patterning the silicon layer and the sacrificial layer on the second active region to form a second silicon pattern and a sacrificial pattern in the second active region;
  forming a first gate spacer on a sidewall of the first silicon pattern and forming a second sate spacer on a sidewall of the second silicon pattern and a sidewall of the sacrificial pattern;
  removing the sacrificial pattern to expose a top surface of the second silicon pattern; and
  forming a first gate silicide on the first silicon pattern and forming a second gate silicide on the second silicon pattern.

13. The method according to claim 10, wherein the sacrificial pattern includes germanium (Ge).

14. The method according to claim 10, wherein the sacrificial pattern is formed of a germanium (Ge) layer or a silicon germanium (SiGe) layer.

15. The method according to claim 10, wherein forming the first and second gate spacers includes:
  forming a first inside spacer on the sidewall of the first silicon pattern and forming a second inside spacer on the sidewall of the second silicon pattern and the sidewall of the sacrificial pattern;
  forming a spacer insulating layer on the semiconductor substrate having the first and second inside spacers using a chemical vapor deposition method; and
  anisotropically etching the spacer insulating layer.

16. The method according to claim 15, wherein forming the first and second gate spacers further includes:
  forming a first LDD region by implanting impurity ions having a first conductivity type into the first active region at both sides of the first silicon pattern; and
  forming a second LDD region by implanting impurity ions having a second conductivity type different from the first conductivity type into the second active region at both sides of the second silicon pattern.

17. The method according to claim 16, further comprising:
  forming a first source/drain region by implanting impurity ions having the first conductivity type into the first active region at both sides of the first silicon pattern; and
  forming a second source/drain region by implanting impurity ions having the second conductivity type Into the second active region at both sides of the second silicon pattern.

18. The method according to claim 10, wherein removing the sacrificial pattern exposes the top surface of the second silicon pattern at a lower level than the top surface of the second gate spacer.

19. The method according to claim 10, further comprising:
  forming a first source/drain silicide in the first active region at both sides of the first silicon pattern; and
  forming a second source/drain silicide in the second active region at both sides of the second silicon pattern.

20. The method according to claim 10, wherein forming the first and second gate silicides and the first and second source/drain silicides includes:
  forming a metal layer on the semiconductor substrate;
  performing an annealing process on the semiconductor substrate and reacting the metal layer with the semiconductor substrate of the first active region, the semiconductor substrate of the second active region, the first silicon pattern and the second silicon pattern to form silicides; and removing unreacted portions of the metal layer.

21. The method according to claim 10, wherein the first and second gate silicides include silicon and at least one of nickel (Ni), cobalt (Co), tungsten (W), tantalum (Ta), titanium (Ti), hafnium (Hf) and platinum (Pt).

22. The method according to claim 10, wherein the second gate silicide is formed thicker than the first gate silicide.

* * * * *